United States Patent
Yazaki et al.

(10) Patent No.: US 9,545,792 B2
(45) Date of Patent: *Jan. 17, 2017

(54) LIQUID EJECTING HEAD, LIQUID EJECTING APPARATUS AND PIEZOELECTRIC ELEMENT

(71) Applicant: Seiko Epson Corporation, Tokyo (JP)

(72) Inventors: Shiro Yazaki, Chino (JP); Takahiro Kamijo, Matsumoto (JP); Tatsuro Torimoto, Matsumoto (JP); Motoki Takabe, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/748,987

(22) Filed: Jun. 24, 2015

(65) Prior Publication Data

US 2015/0290937 A1 Oct. 15, 2015

Related U.S. Application Data

(63) Continuation of application No. 14/150,055, filed on Jan. 8, 2014, now Pat. No. 9,099,636, which is a continuation of application No. 13/684,750, filed on Nov. 26, 2012, now Pat. No. 8,651,627.

(30) Foreign Application Priority Data

Nov. 28, 2011 (JP) ................. 2011-258608

(51) Int. Cl.
*B41J 2/14* (2006.01)
*H01L 41/053* (2006.01)
*H01L 41/09* (2006.01)

(52) U.S. Cl.
CPC ......... *B41J 2/14201* (2013.01); *B41J 2/14233* (2013.01); *H01L 41/0533* (2013.01); *H01L 41/0973* (2013.01); *B41J 2002/14241* (2013.01); *B41J 2002/14491* (2013.01)

(58) Field of Classification Search
CPC . B41J 2/14201; B41J 2/14233; B41J 41/0533; B41J 41/0973; B41J 2002/14241; B41J 2002/14491
USPC ...................................... 347/68–72
See application file for complete search history.

(56) References Cited

U.S. PATENT DOCUMENTS

| 6,089,701 A | 7/2000 | Hashizume et al. |
| 6,158,847 A * | 12/2000 | Usui et al. ........... 347/70 |
| 8,651,627 B2 * | 2/2014 | Yazaki ......... H01L 41/0533 347/68 |
| 9,099,636 B2 * | 8/2015 | Yazaki ......... H01L 41/0533 |
| 2003/0156163 A1 | 8/2003 | Watanabe et al. |

(Continued)

FOREIGN PATENT DOCUMENTS

| JP | 2003-110160 A | 4/2003 |
| JP | 2009-172878 A | 8/2009 |
| JP | 2010-042683 A | 2/2010 |

*Primary Examiner* — Henok Legesse
(74) *Attorney, Agent, or Firm* — Harness, Dickey & Pierce, P.L.C.

(57) ABSTRACT

A piezoelectric element includes a plurality of individual electrodes, a piezoelectric layer formed on each of individual electrodes, and a common electrode which is formed on the piezoelectric layer and is an electrode common to the individual electrodes. Further, a protection film covering a region, which is not covered by the common electrode on the individual electrode, is provided.

14 Claims, 7 Drawing Sheets

(56) References Cited

U.S. PATENT DOCUMENTS

| | | | |
|---|---|---|---|
| 2009/0219347 A1* | 9/2009 | Sugahara | 347/70 |
| 2009/0284568 A1 | 11/2009 | Yazaki | |
| 2010/0231658 A1 | 9/2010 | Shimada | |
| 2011/0193916 A1* | 8/2011 | Hirai | B41J 2/14233 347/71 |
| 2014/0118447 A1* | 5/2014 | Yazaki et al. | 347/70 |

* cited by examiner

LIQUID EJECTING HEAD, LIQUID EJECTING APPARATUS AND PIEZOELECTRIC ELEMENT

CROSS-REFERENCE TO RELATED APPLICATIONS

This is a continuation patent application of U.S. application Ser. No. 14/150,055 filed Jan. 8, 2014, which is a continuation patent application of U.S. application Ser. No. 13/684,750 filed Nov. 26, 2012, now U.S. Pat. No. 8,651,627, issued Feb. 18, 2014, which claims priority to Japanese Patent Application No. 2011-258608, filed Nov. 28, 2011 all of which are incorporated by reference herein in their entireties.

BACKGROUND

1. Technical Field

The present invention relates to a liquid ejecting head, a liquid ejecting apparatus and a piezoelectric element.

2. Related Art

A piezoelectric element, which has the characteristics of being charged when the crystal is distorted and of being distorted when placing in an electric field, is widely used in liquid ejecting apparatuses such as an ink jet printer, an actuator, a sensor or the like.

In addition, the configuration of the piezoelectric element, of which a lower electrode is set as an individual electrode for each piezoelectric layer and an upper electrode is set as a common electrode which is common with respect to a plurality of individual electrodes, is known (for example, in JP-A-2010-42683).

In the piezoelectric element having the upper electrode as the common electrode, a crack or burnout may occur in a region of the piezoelectric layer which is not covered with the upper electrode. As a cause thereof, it is thought that the composition of the piezoelectric layer is unstable by chemicals or the like used when patterning of the upper electrode or wiring.

SUMMARY

An advantage of some aspects of the invention is to improve the stability of at least a piezoelectric element, a liquid ejecting head and a liquid ejecting apparatus.

According to an aspect of the invention, there is provided a piezoelectric element including a plurality of individual electrodes; a piezoelectric layer formed on the individual electrodes; a common electrode formed on the piezoelectric layer and is an electrode common to the individual electrodes; and a protection film covering a region of the piezoelectric layer which is not covered by the common electrode on the individual electrodes.

In the invention having the configuration described above, the piezoelectric element is configured of the upper electrode as the common electrode. In addition, the protection film covers the region of the piezoelectric layer which is not covered by the common electrode on the individual electrodes. Thus, cracking or burnout may be decreased at the region which is not covered by the common electrode on the individual electrodes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention is described in detail based on embodiments. Configurations described in the embodiments are merely examples and the invention is not limited to the examples.

1. Configuration of Liquid Ejecting Head and Piezoelectric Element

Figure 1A:
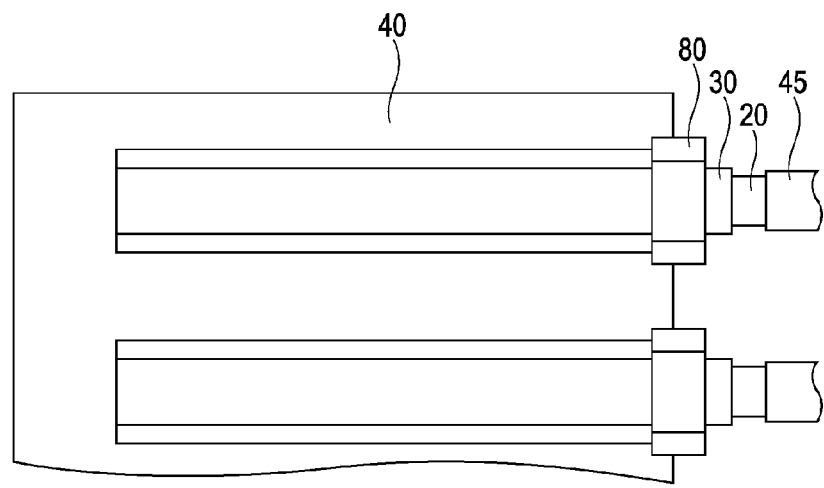
FIGS. 1A and 1B are a partial top view and a vertical cross-sectional view respectively illustrating a main portion of a piezoelectric element included in a liquid ejecting head according to an embodiment of the invention.
Figure 1B:
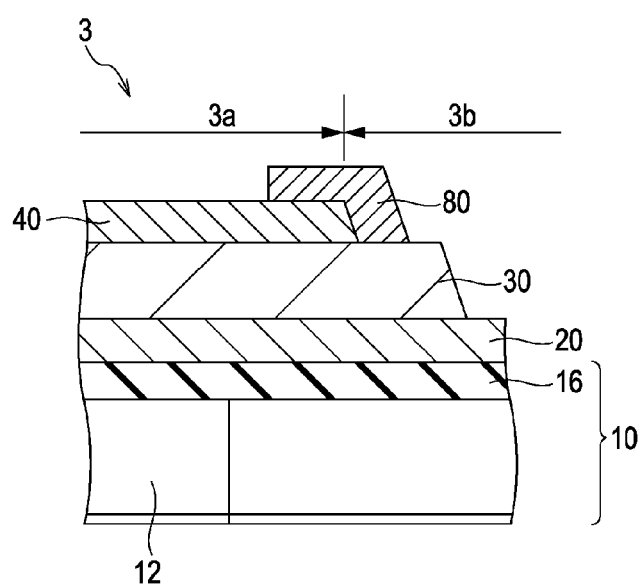
Figure 2:
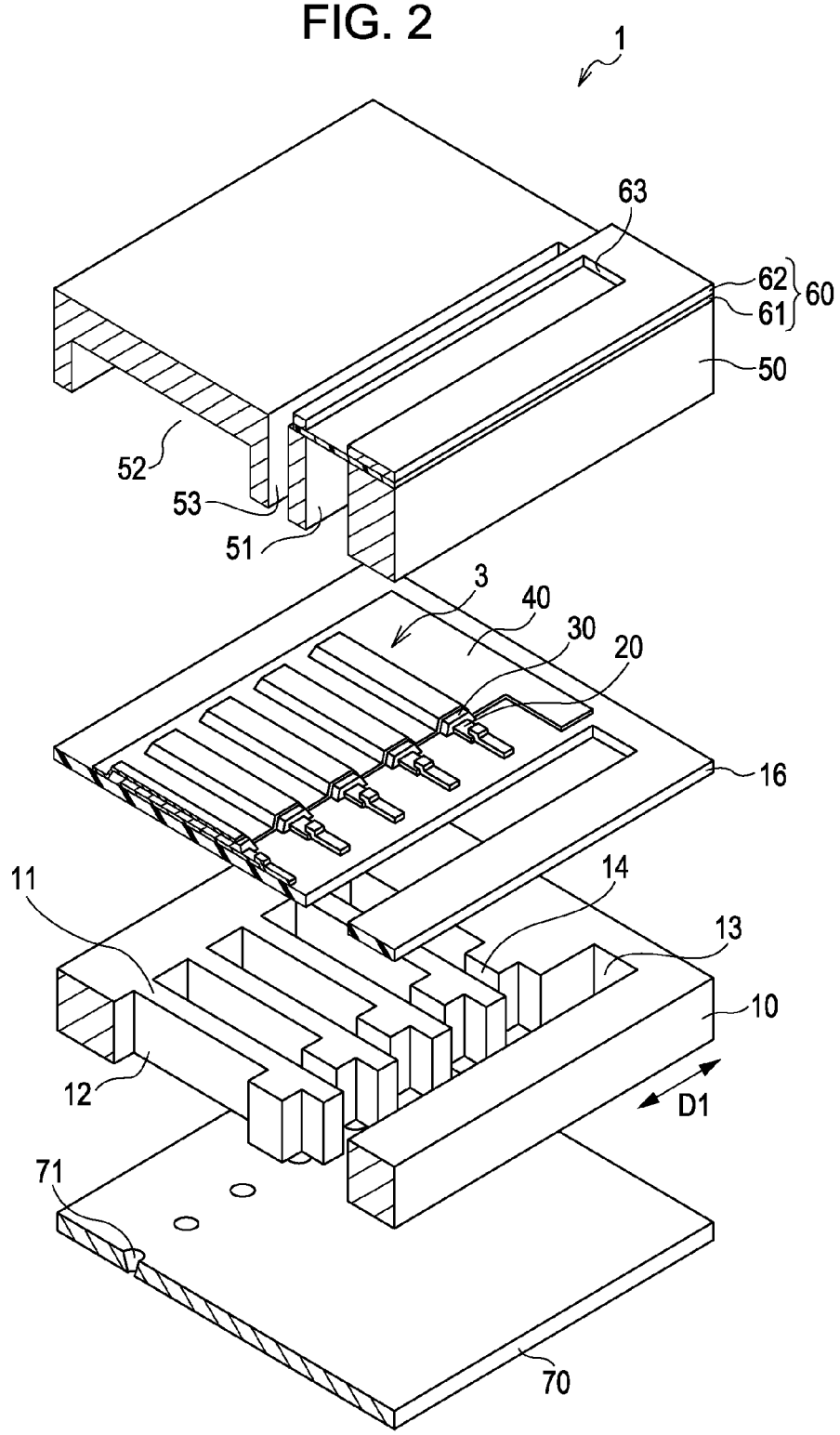
FIG. 2 is an exploded perspective view illustrating an exploded ink jet type recording head that is an example of the liquid ejecting head.
Figure 3A:
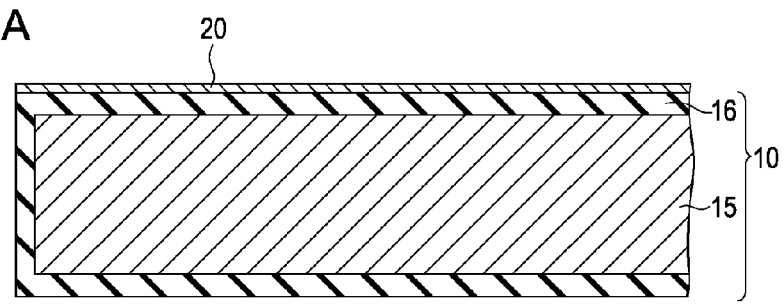
FIGS. 3A to 3C are cross-sectional views for explaining a manufacturing process of the recording head.
Figure 3B:
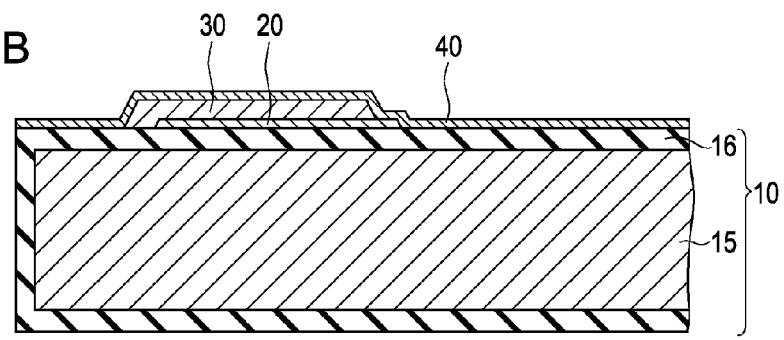
Figure 3C:
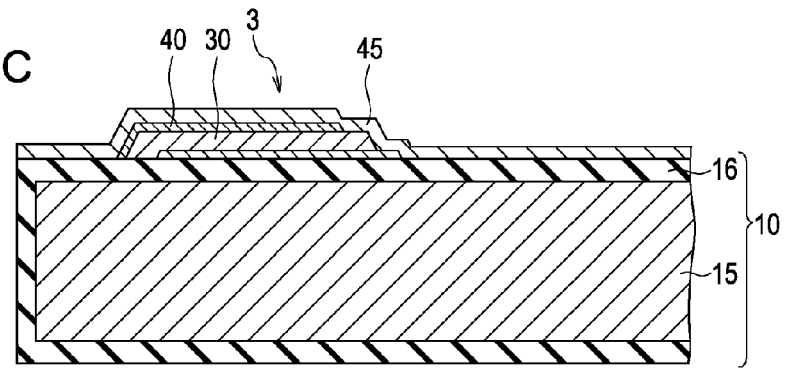
Figure 4A:
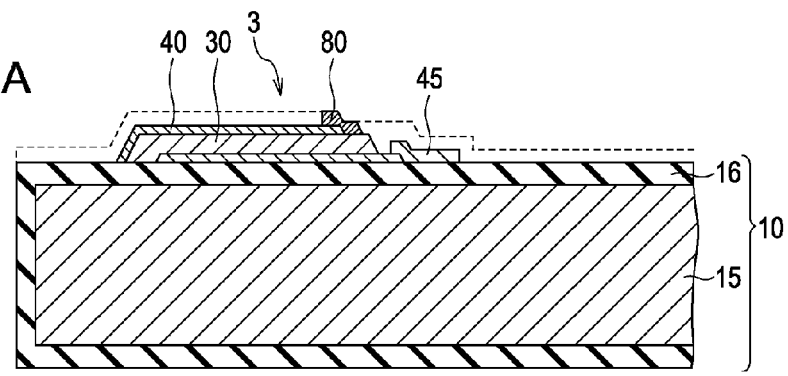
FIGS. 4A to 4C are cross-sectional views for explaining a manufacturing process of the recording head.
Figure 4B:
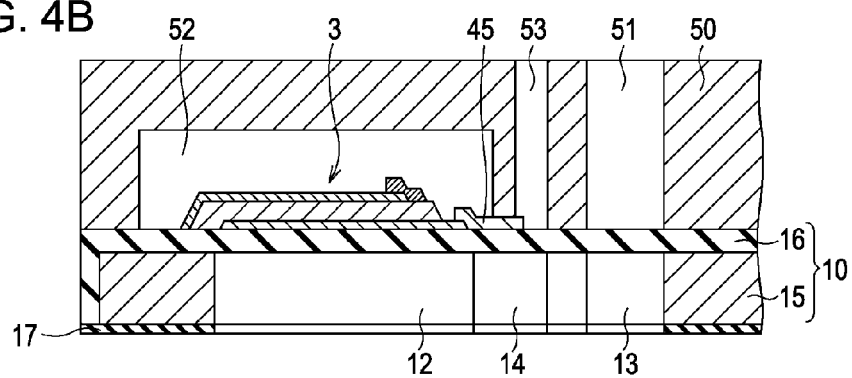
Figure 4C:
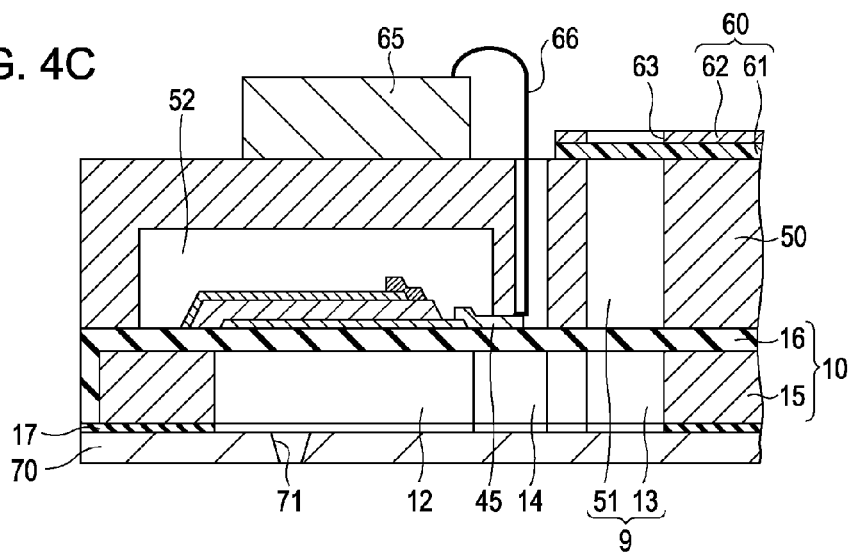

FIGS. 1A and 1B are a partial top view and a vertical cross-sectional view respectively illustrating a main portion of a piezoelectric element 3 included in a liquid ejecting head according to an embodiment of the invention. In addition, FIG. 2 is an exploded perspective view illustrating an exploded ink jet type recording head 1 that is an example of the liquid ejecting head. FIGS. 3A to 3C are cross-sectional views for explaining a manufacturing process of the recording head 1. Further, FIGS. 4A to 4C are cross-sectional views for explaining a manufacturing process of the recording head 1.

The recording head (the liquid ejecting head) 1 illustrated in FIG. 2 includes a piezoelectric element 3 having a piezoelectric layer 30, electrodes 20 and 40, and a pressure generation chamber 12 which communicates with a nozzle opening 71 and in which pressure change is generated by the piezoelectric element 3. More specifically, the piezoelectric element 3 is configured by laminating a lower electrode 20, the piezoelectric layer 30 and an upper electrode 40 in this order on a vibration plate 16 including an elastic film.

In addition, a flow path formation substrate 10 is fixed in a side where the piezoelectric element 3 of the vibration plate 16 is not laminated. A plurality of pressure generation chambers 12 is arranged in parallel in the width direction thereof at the flow path formation substrate 10. In addition, a communication path 13 is formed at a region outside the pressure generation chamber of the flow path formation substrate 10 in the longitudinal direction. The communication path 13 is communicated with the pressure generation chamber 12 via an ink supply path 14 provided for each pressure generation chamber 12.

In addition, a nozzle plate 70 is fixed in a side of the flow path formation substrate 10 where the vibration plate 16 is not fixed. A plurality of nozzle openings 71, through which ink is discharged and which configures a portion of the flow path, is penetrated into the nozzle plate 70. Further, a protection substrate 50, where a compliance substrate 60 is fixed, is fixed in a side of the vibration plate 16 where the piezoelectric element 3 is fixed.

Next, the configuration of the piezoelectric element 3 is described with reference to FIGS. 1A and 1B.

As shown in FIG. 1A, the piezoelectric element 3 has the upper electrode 40 as the common electrode and is formed by being laminated on the vibration plate 16.

In other words, as shown in FIG. 1B, the lower electrode 20 having a layer, which contains at least one of platinum (Pt), iridium (Ir) and titanium (Ti), is laminated immediately above the vibration plate 16. The lower electrode 20 is an individual electrode and is formed for every four piezoelectric elements in the embodiment. Of course, that the number of piezoelectric elements is four is an example and the invention is not limited thereto.

In addition, the piezoelectric layer 30 including at least lead (Pb), zirconium (Zr) and titanium (Ti) is laminated immediately above the lower electrode 20. The piezoelectric layer 30 is configured by a perovskite type oxide and is configured by lead zirconate titanate which includes Pb in an A site element and Zr and Ti are included in a B site element. As described above, the perovskite type oxide may be a perovskite type oxide having a composition indicated in the general formulae described below.

$$Pb(Zr,Ti)Ox \tag{1}$$

$$(Pb,MA)(Zr,Ti)Ox \tag{2}$$

$$Pb(Zr,Ti,MB)Ox \tag{3}$$

$$(Pb,MA)(Zr,Ti,MB)Ox \tag{4}$$

Here, MA is one or more metal elements excluding Pb and MB is one or more types of metal elements excluding Zr, Ti and Pb. As for x, 3 is a standard, however, it may shift from 3 in a range in which the perovskite structure may be obtained. As for the ratio between the A site element and the B site element, 1:1 is a standard, however, it may be shifted from 1:1 in a range in which the perovskite structure is taken.

The MB element includes Nb (niobium), Ta (tantalum) or the like.

In addition, that the piezoelectric layer 30 is formed of lead zirconate titanate is only an example and in addition thereto, it may be formed of a piezoelectric material having a composition of (Bi, Ba) (Zr, Ti) Ox that is a lead-based piezoelectric material or a non-lead-based piezoelectric material.

The upper electrode 40 is laminated immediately above the piezoelectric layer 30. The upper electrode 40 is the common electrode which is common in all the piezoelectric elements 3 and is formed on each piezoelectric layer 30 in succession. The metal constituting the upper electrode 40 may use iridium (Ir), gold (Au), platinum (Pt), or the like. Of course, in addition thereto, it may contain metals different from the metals described above.

As shown in FIG. 1B, an end portion of the lower electrode 20 in the longitudinal direction is extended further to the outside than an end portion of the pressure generation chamber 12 in the longitudinal direction. In addition, an end portion of the upper electrode 40 in the longitudinal direction, where the patterning is performed corresponding to each pressure generation chamber 12, is positioned before the end portion of a region where the lower electrode 20 is formed in the longitudinal direction. In addition, the end portion of the upper electrode 40 in the longitudinal direction is extended further to the outside than the end portion of the pressure generation chamber 12 in the longitudinal direction. In other words, the piezoelectric layer 30 has a region which is positioned on the lower electrode 20 and is not covered by the upper electrode 40, and a region which is positioned on the lower electrode 20 and is covered by the upper electrode 40. Of course, the positional relationship between the end portions of the lower electrode 20 and the upper electrode 40 in the longitudinal direction is merely an example and for example, the end portion of the upper electrode 40 in the longitudinal direction may be formed before the end portion of the pressure generation chamber 12 in the longitudinal direction.

In addition, a region, which is deformed by action of the electric field, is defined as an active section 3a and a region, which is not deformed by the action of the electric field is defined as a non-active section 3b in the piezoelectric element 3. In the piezoelectric element 3 illustrated in FIG. 1B, the active section 3a is the region in which the lower electrode 20 is provided and the upper electrode 40 is provided in the region in which the piezoelectric layer 30 is provided, and the non-active section 3b is the region in which the lower electrode 20 is provided and which is not covered by the upper electrode 40 in the region in which the piezoelectric layer 30 is provided. In addition, since the boundary of the active section 3a and the non-active section 3b is also influenced by the position of the generated electric field, the boundary is not necessarily defined by the position of the lower electrode 20 and the upper electrode 40 described above.

A protection film 80 is formed at the region which includes the boundary of the active section 3a where the upper electrode 40 is formed and the non-active section 3b in the piezoelectric layer 30 in order to cover the region. In FIG. 1B, the protection film 80 is formed on the piezoelectric layer 30 to cover the region which is not covered by the upper electrode 40 above the lower electrode 20.

Here, it is understood that cracking or the burnout caused by cracking may occur remarkably near the boundary of the active section 3a and the non-active section 3b in the piezoelectric layer 30. It is known that as one causes thereof, the upper electrode 40 is formed by patterning or the wiring is formed by patterning after the upper electrode film is formed on the piezoelectric layer 30 in the piezoelectric element 3 having the upper electrode 40 as the common electrode, and chemicals or the like are attached on the piezoelectric layer 30 when performing the patterning and the composition of the piezoelectric layer 30 is unstable. In addition, as another cause, there is stress concentration due to unevenness in state of the occurrence of distortion in the piezoelectric layer 30 near the boundary of the active section 3a and the non-active section 3b in the piezoelectric layer 30. Thus, the protection film 80 is formed to cover the boundary of the active section 3a and the non-active section 3b and then the region has a configuration which decreases the occurrence of the cracking and the burnout.

In addition, it is preferable that the end portion of the upper electrode 40 be formed before above the pressure generation chamber 12 in the longitudinal direction of the protection film 80. In other words, it is preferable that the protection film 80 not be formed upwards the region where the pressure generation chamber 12 is formed. The protection film 80 is formed away from the region in which the pressure generation chamber 12 is formed so that the piezoelectric element 3 is prevented from hindering the drive.

As the material of the protection film 80, an organic material such as polyimide (aromatic polyimide) may be used. When the protection film 80 is formed from polyimide, it is preferable that the thickness of the film be 1.7 μm or more. In addition, besides this, the protection film 80 may be formed from an epoxy-based adhesive or silicon-based adhesive. In addition, when the protection film 80 is formed by the adhesive, it is preferable that the thickness of the film be 1.6 μm or more.

When the protection film 80 is the organic protection film, the protection film 80 may be easily formed.

2. Manufacturing Method of Piezoelectric Element and Liquid Ejecting Head

Manufacturing method of the piezoelectric element 3 and the recording head (the liquid ejecting head) 1 including the piezoelectric element 3 described above is described with reference to FIGS. 2 to 4. In addition, here, the description is given as an example in a case where the polyimide (the organic protection film) is used as the protection film 80.

As the manufacturing method of the recording head 1, first, the flow path formation substrate 10 is formed of a silicon single-crystal substrate. An elastic film (the vibration plate 16) consisting of silicon dioxide ($SiO_2$) is for example, integrally formed by performing thermal oxidation of the silicon substrate 15 having a film thickness of about 625 μm that is relatively thick and has a high stiffness, in a diffusion path at about 1100° C. The thickness of the elastic film is not limited as long as the film has elasticity, and for example, may be about 0.5 to 2 μm.

Next, as shown in FIG. 3A, a lower electrode film is formed by a sputtering method or the like in order to configure the lower electrode 20 on the vibration plate 16. As the configuring metal of the lower electrode 20, one or more metals of Pt, Au, Ir, Ti and the like may be used. The thickness of the lower electrode is not specifically limited and for example, may be about 50 to 500 nm. In addition, as a coherence layer or a diffusion blocking layer, the lower electrode 20 may be formed after a layer such as TiAlN (titanium nitride aluminum) film, Ir film, IrO (iridium oxide) film, $ZrO_2$ (zirconium oxide) film or the like is formed on the vibration plate 16.

Next, a precursor solution including at least lead salt, zirconium salt and titanium salt is coated on the surface of the lower electrode 20. The metal molar concentration ratio in the precursor solution may be determined according to the composition of the perovskite type oxide which is formed. In the formulae (1) to (4) described above, as the mole ratio of the A site element and the B site element, 1:1 is a standard, and it may be shifted from 1:1 in a range in which the perovskite oxide is formed.

The precursor solution coated as shown in FIG. 3A is crystallized and then the piezoelectric layer 30 is formed. As an example, preferably, the precursor solution is heated to about 140° C. to 190° C. and dried, after that, for example, is heated to about 300° C. to 400° C. and defatted, and then for example, is heated to about 550° C. to 850° C. and then crystallized.

In addition, in order to thicken the piezoelectric layer 30, a combination of a coating process, a drying process, a defatting process and a calcination process may be performed several times. In order to reduce the calcination process, the calcination process may be performed after the combination of the coating process, the drying process and the defatting process is performed several times. Further, these combination of the processes may be performed several times. In the example illustrated in FIG. 3B, the lower electrode 20 and the piezoelectric layer 30 are patterned on the region opposite each pressure generation chamber 12, after forming the piezoelectric layer 30 on the lower electrode film 20.

In addition, a heating device for performing the drying and the defatting described above may use an infrared lamp annealing device heated by a hot plate and irradiation of an infrared lamp. In addition, the heating device for performing the calcination described above may use the infrared lamp annealing device or the like. It is preferable that the temperature rising rate be relatively fast using RTA (Rapid Thermal Annealing) or the like.

As shown in FIG. 3B, the upper electrode 40 is formed on the piezoelectric layer 30 formed described above using the sputtering method or the like. As the metal configuring the upper electrode, at least one of metals of Ir, Au, Pt or the like may be used. The thickness of the upper electrode is not specifically limited and, for example, may be about 10 to 200 nm. In addition, in the example illustrated in FIG. 3C, the upper electrode film is patterned on the region opposite each pressure generation chamber 12 and then the piezoelectric element 3 is formed, after forming the upper electrode film.

Next, a lead electrode 45 is formed. For example, as shown in FIG. 3C, after forming the metal over the front surface of the flow path formation substrate 10, the patterning is performed for each piezoelectric element 3 through the mask pattern configured of the resist or the like and then the lead electrode 45 is provided (FIG. 4A). The lead electrode 45 extending from the vicinity of end portion of the ink supply path 14 side to the vibration plate 16 is connected to each lower electrode 20 shown in FIG. 2.

The lower electrode 20, the upper electrode 40 or the lead electrode 45 can be formed using a sputtering method such as a DC (direct current) magnetron sputtering method. The thickness of each layer may be adjusted by changing the application voltage or a sputtering process time of the sputtering device.

In addition, as shown in FIG. 4A, the protection film 80 is formed to cover the boundary of the active section and the non-active section of the piezoelectric layer 30. As the formation method of the protection film 80, for example, first, the polyimide film is formed on the piezoelectric layer 30 including the upper electrode 40. Next, for example, the patterning is performed on the layer of the polyimide via the mask pattern configured of the resist or the like and the dry etching is performed, thereby forming the protection film 80. In addition, when the photosensitive polyimide is used as the protection film 80, the exposure and the development are performed and then patterning may be performed using the mask pattern, after film formation.

As described above, the piezoelectric element 3 having the piezoelectric layer 30 and the electrodes (20 and 40) is formed, and a piezoelectric actuator including the piezoelectric element 3 and the vibration plate 16 is formed.

Next, as shown in FIG. 4B, the protection substrate 50 having a piezoelectric element holding section 52 or the like beforehand is joined on the flow path formation substrate 10, for example, using an adhesive. As the protection substrate 50, for example, a silicon single-crystal substrate, glass, ceramic material or the like may be used. The thickness of the protection substrate 50 is not specifically limited, and it may be for example, about 400 μm. A reservoir section 51, which penetrates the protection substrate 50 in the thickness direction, configures a reservoir 9 that is a common ink chamber with the communication path 13. The piezoelectric element holding section 52 provided at the region opposite the piezoelectric element 3 has sufficient space to not obstruct the movement of the piezoelectric element 3. The vicinity of the end portion of the lead electrode 45, which is drawn out from each piezoelectric element 3, is exposed to a through hole 53 of the protection substrate 50.

Next, after polishing the silicon substrate 15 to a certain thickness, wet etching is performed using fluonitric acid and then the silicon substrate 15 is a predetermined thickness (for example, about 70 μm). Next, as shown in FIG. 4B, a mask film 17 is newly formed on the silicon substrate 15 and the patterning is performed in a predetermined shape. As the mask film 17, silicon nitride (SiN) or the like may be used. Next, anisotropic etching (wet etching) is performed on the silicon substrate 15 using alkaline solution such as KOH. Accordingly, a plurality of liquid paths including the pressure generation chamber 12 partitioned by a plurality of partition walls 11 (see, FIG. 2) and narrow ink supply path 14, and the communication path 13 that is the common liquid path connected to each ink supply path 14 are formed. The liquid paths (12 and 14) are arranged in the width direction D1 which is a lateral direction of the pressure generation chamber 12.

In addition, the pressure generation chamber 12 may be formed before the formation of the piezoelectric element 3.

Next, as shown in FIG. 4C, the nozzle plate 70 is joined to a side of the silicon substrate 15 that is opposite the protection substrate 50. As the nozzle plate 70, glass, ceramic, a silicon single-crystal substrate, stainless steel or the like may be used. The nozzle plate 70 is fixed to the opening side of the flow path formation substrate 10. In order to fix the adhesive, a thermal welding film or the like may be used. A nozzle opening 71, which communicates with the vicinity of the end portion opposite the ink supply path 14 of each pressure generation chamber 12, is penetrated into the nozzle plate 70. Accordingly, the pressure generation chamber 12 communicates with the nozzle opening 71 discharging the liquid.

Next, the compliance substrate 60 having a sealing film 61 and a fixing plate 62 is joined on the protection substrate 50. As the sealing film 61, for example, a material which is formed of polyphenylene sulfide (PPS) film having a thickness of about 6 μm and low stiffness and flexibility may be used. The sealing film 61 seals one side surface of the reservoir section 51. As the fixing plate 62, for example, a hard material such as the metal of stainless steel (SUS) having a thickness of about 30 μm may be used. A region opposite the reservoir 9 is an opening 63.

In addition, a driving circuit 65 for driving the piezoelectric elements 3, which are arranged in parallel, is fixed on the protection substrate 50. As the driving circuit 65, a circuit substrate, a semiconductor integrated circuit (IC), or the like may be used. The driving circuit 65 and the lead electrode 45 are electrically connected via a connection wiring 66. As the connection wiring 66, a conductive wire or the like such as a bonding wire may be used.

As described above, the recording head 1 is manufactured.

The recording head 1 loads the ink from an ink induction port connected to the outside ink supply unit (not shown) and fills the inside thereof with the ink from the reservoir 9 to the nozzle opening 71. When the voltage is applied to between the lower electrode 20 and the upper electrode 40 for each pressure generation chamber 12 according to the recording signal from the driving circuit 65, ink droplets are discharged from the nozzle opening 71 due to the deformation of the piezoelectric layer 30, the lower electrode 20 and the vibration plate 16.

3. Liquid Ejecting Apparatus

Figure 5:
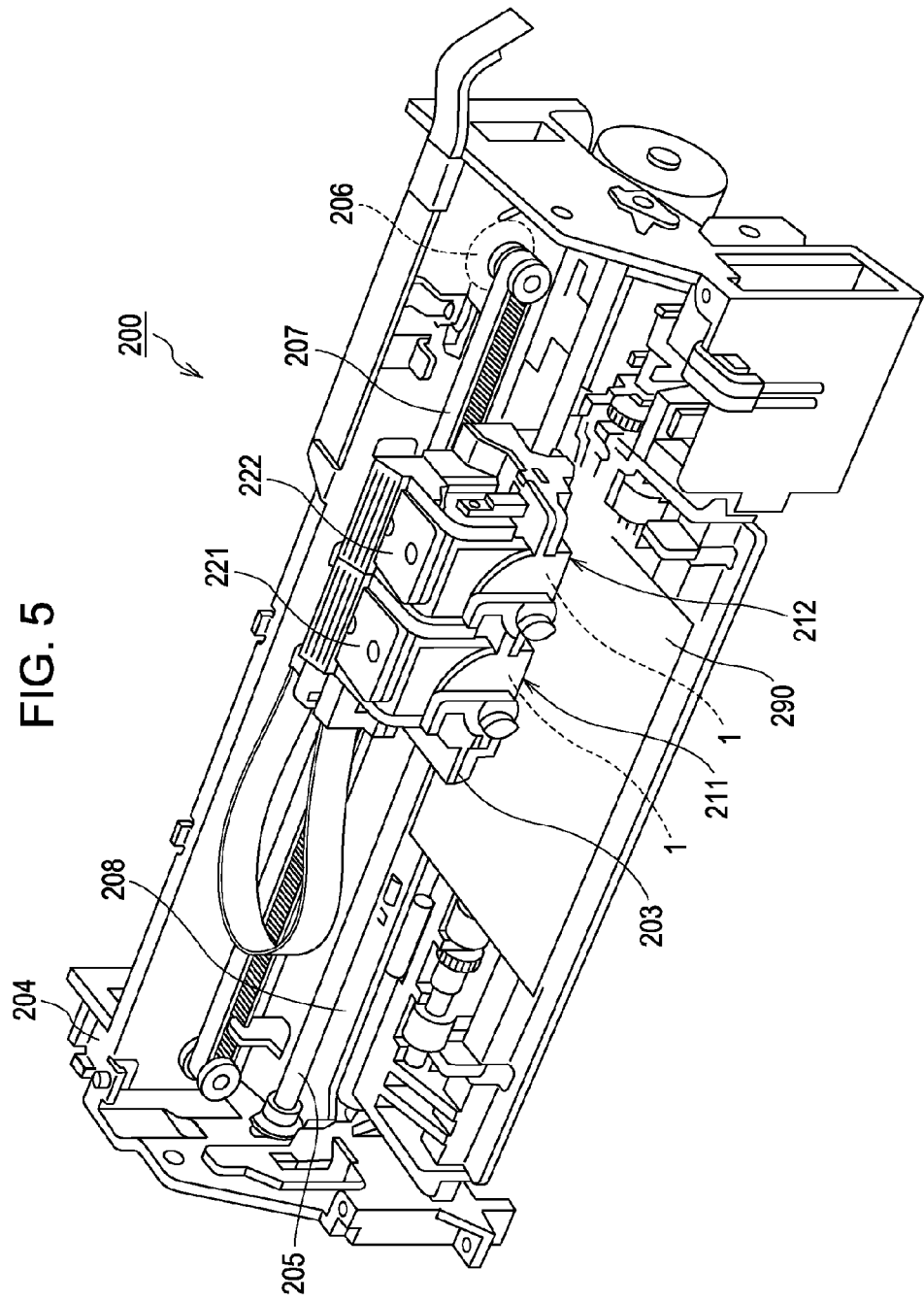
FIG. 5 is an external view of a recording apparatus (a liquid ejecting apparatus) having the recording head described above.

FIG. 5 illustrates an external appearance of a recording apparatus (liquid ejecting apparatus) 200 having the recording head 1 described above. When the recording head 1 is assembled into recording head units 211 and 212, the recording apparatus 200 may be manufactured. The recording apparatus 200 shown in FIG. 5 is configured in such a manner that the recording head 1 is provided in each of recording head units 211 and 212, and ink cartridges 221 and 222, which are outside ink supply units, are detachably provided. A carriage 203 having the recording head units 211 and 212 is provided so as to be movable reciprocally along a carriage shaft 205 attached to an apparatus main body 204. When driving force of a driving motor 206 is transmitted to the carriage 203 via a plurality of gears (not shown) and a timing belt 207, the carriage 203 moves along the carriage shaft 205. A recording sheet 290, which is fed using a feeding roller (not shown) or the like, is transported on a platen 208 and the print is performed on the recording sheet using the ink which is supplied from the ink cartridges 221 and 222 and discharged from the recording head 1.

4. Embodiment

Hereinafter, the embodiment is illustrated and the invention is not limited to the example described below.

Here, the ink jet type recording heads of the embodiments 1 to 3 described below were manufactured and a DC electricity test was performed on the piezoelectric element.

Embodiment 1

The ink jet type recording head was the embodiment 1 which has the protection film configured from the polyimide having the film thickness of 0.7 μm to cover the end portion of the active section (vicinity of the boundary of the active section and the non-active section) in the piezoelectric element. The Young's modulus E of the polyimide is 3.0 GPa.

Embodiment 2

The ink jet type recording head similar to the embodiment 1 was an embodiment 2 besides the protection film configured from the polyimide having the film thickness of 2.6 μm.

Embodiment 3

The ink jet type recording head similar to the embodiment 1 was an embodiment 3 besides the protection film configured from the adhesive having the film thickness of 3.0 μm. In addition, the Young's modulus E of the adhesive is 3.0 GPa.

Table 1 illustrates each condition (the film thickness t, the Young's modulus E, product of the Young's modulus and the film thickness: E×t) of the embodiments 1 to 4 and the states of the burnout at the end portions of the active section, when performing evaluation of withstanding voltage. A case of "○" indicates that the burnout did not occur and a case of "Δ" indicates that the burnout decreased compared to a case where the protection film is not formed.

TABLE 1

|  | Material | Film Thickness (t) | Young's Modulus (E) | E × t | Burnout |
|---|---|---|---|---|---|
| Embodiment 1 | Polyimide | 0.7 μm | 3 GPa | 2100 | Δ |
| Embodiment 2 | Polyimide | 2.6 μm | 3 GPa | 7800 | ○ |
| Embodiment 3 | Adhesive | 3.0 μm | 3 GPa | 9000 | ○ |

As shown in Table 1, in the embodiments 2 and 3 where the product of the Young's modulus E and the film thickness t is 7800 (Pa·m) or more, the burnout was observed at the end portion of the active section 3a. In addition, in the embodiment 1 where the product of the Young's modulus E and the film thickness t is 2100 (Pa·m), a decrease in the burnout was observed at the end portion of the active section 3a.

As described above, it was understood that the protection film 80 is formed to cover the boundary of the active section 3a and the non-active section 3b and then the burnout is suppressed. In addition, it was understood that when the product of the Young's modulus E and the film thickness t is 2000 (Pa·m) or more, the burnout may be decreased and more preferably, when the product of the Young's modulus E and the film thickness t is 7800 (Pa·m) or more, the burnout did not occur.

5. Second Embodiment

Figure 6A:
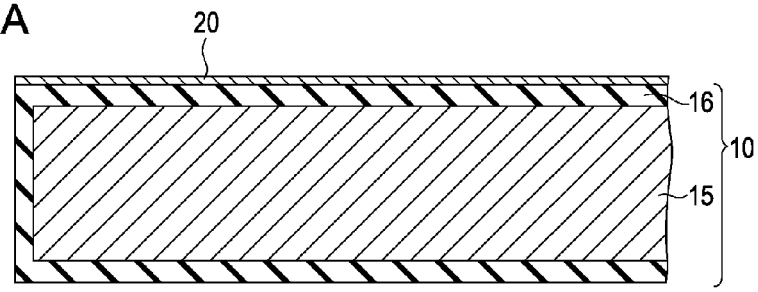
FIGS. 6A to 6C are cross-sectional views for explaining a manufacturing process of the recording head.
Figure 6B:
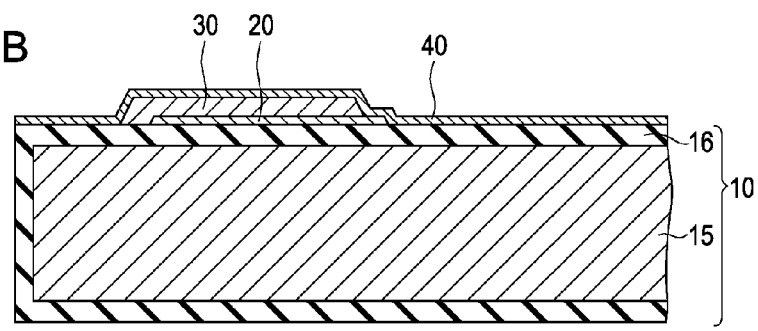
Figure 6C:
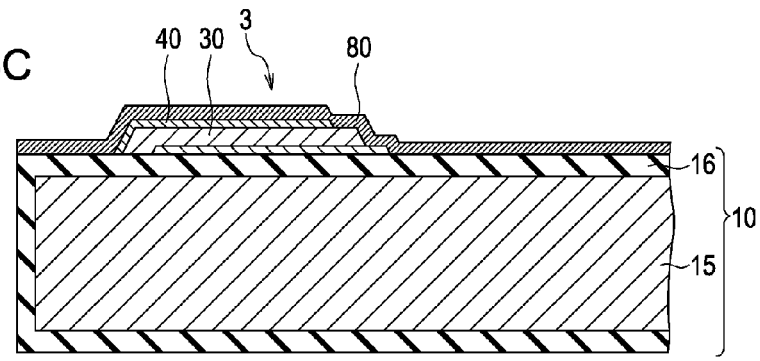
Figure 7A:
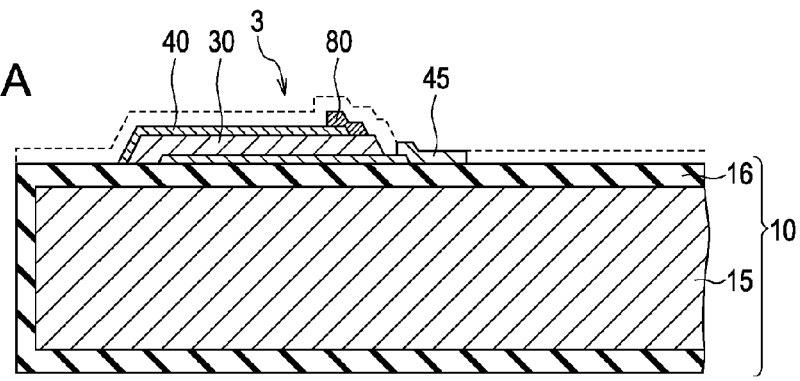
FIGS. 7A to 7C are cross-sectional views for explaining a manufacturing process of the recording head.
Figure 7B:
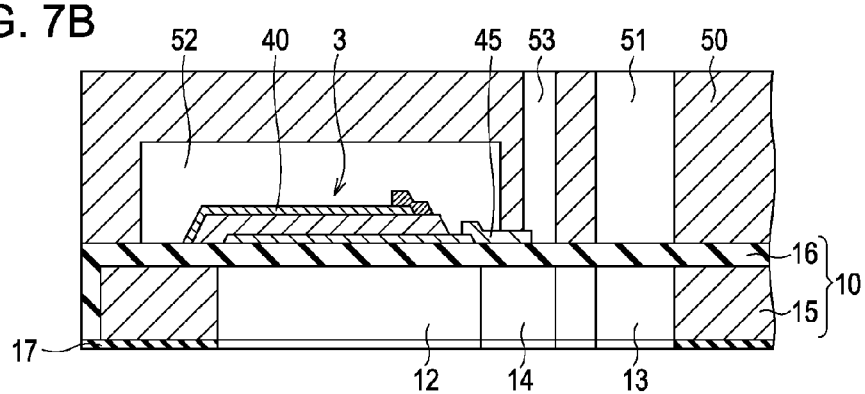
Figure 7C:
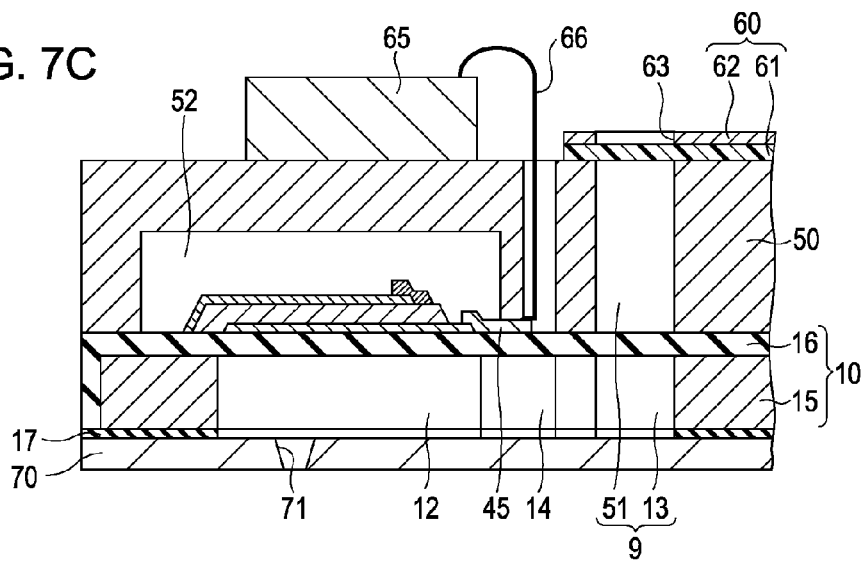

Hereinafter, as the second embodiment, a case where the protection film 80 is an inorganic protection film is described. FIGS. 6A to 6C are cross-sectional views for illustrating a manufacturing process of the recording head 1. FIGS. 7A to 7C are cross-sectional views for illustrating a manufacturing process of the recording head 1.

The protection film 80 according to the second embodiment is the same as that of the first embodiment in the configuration where the protection film 80 covers the boundary of the active section 3a and the non-active section 3b in the piezoelectric layer 30. Meanwhile, the second embodiment differs from the first embodiment in that sequence of a process in which the protection film 80 is formed is immediately after a process in which the upper electrode 40 is formed. It is caused by the protection film 80 that is formed using the inorganic material in the second embodiment, while the protection film 80 is formed using the organic material in the first embodiment.

As an example, the protection film 80 according to the second embodiment is formed from, for example, aluminum oxide ($Al_2O_3$) as the inorganic protection film. In addition, in a case where the protection film 80 is formed from $Al_2O_3$, it is preferable that the film thickness be 25 nm or more.

The manufacturing method of the piezoelectric element 3 and the recording head (liquid ejecting head) 1 including the piezoelectric element 3 described above is described with reference to FIGS. 6A to 7C. Further, a case where $Al_2O_3$ (inorganic protection film) is used as the protection film 80 is described as an example. In addition, each condition when configuring the recording head 1 is the same as that of the first embodiment.

First, similar to the first embodiment, the flow path formation substrate 10 is formed from the silicon single-crystal substrate or the like. The elastic film (the vibration plate 16) configured of silicon dioxide ($SiO_2$) is integrally formed by performing thermal oxidation of the silicon substrate 15, in the diffusion path of about 1100° C.

Next, as shown in FIG. 6A, the lower electrode 20 is formed by the sputtering method or the like on the vibration plate 16. As shown in FIG. 6B, the piezoelectric layer 30 is formed by crystallizing the coated precursor solution. As shown in FIG. 6B, the upper electrode 40 is formed by the sputtering method or the like on the piezoelectric layer 30 formed as described above.

In addition, the protection film 80 is formed to cover the boundary of the active section 3a and the non-active section 3b of the piezoelectric layer 30. As the formation method of the protection film 80, as shown in FIG. 6C, first, the film of $Al_2O_3$ is coated on the piezoelectric layer 30 including the upper electrode 40. Next, for example, the patterning is performed on the layer of aluminum oxide via the mask pattern configured of the resist or the like and the dry etching is performed and then the protection film 80 is formed.

Next, as shown in FIG. 7A, the lead electrode 45 is formed on the protection film 80. For example, patterning is performed for each piezoelectric element 3 through the mask pattern configured of the resist and the like and then the lead electrode 45 is provided, after forming the metal layer over the front surface of the flow path formation substrate 10. In other words, in the second embodiment, patterning is performed to form the lead electrode 45, after the protection film 80 is formed. Thus, the piezoelectric layer 30 may be protected by the protection film 80 from the chemicals used when patterning the lead electrode 45.

In addition, as shown in FIG. 7B, the protection substrate 50 having a piezoelectric element holding section 52 or the like beforehand is joined on the flow path formation substrate 10, for example, using the adhesive. Next, the mask film 17 is newly formed on the silicon substrate 15 and the patterning is performed in a predetermined shape. In addition, as shown in FIG. 7C, the nozzle plate 70 is joined to the side of the silicon substrate 15 opposite the protection substrate 50. Next, the compliance substrate 60 having the sealing film 61 and the fixing plate 62 is joined on the protection substrate 50 and is divided into a predetermined chip size. As described above, the recording head 1 is formed.

6. Embodiment

Hereinafter, embodiments according to the second embodiment are illustrated and the invention is not limited to the examples described below.

Here, the ink jet type recording head of the embodiment 4 described below was manufactured and the DC electricity test was performed on the piezoelectric element.

Embodiment 4

The ink jet type recording head was the embodiment 4 which has the protection film configured from $Al_2O_3$ having the film thickness of 90 nm to cover the end of the active section (the vicinity of the boundary of the active section and the non-active section) of the piezoelectric layer configuring the piezoelectric element. The Young's modulus E of the $Al_2O_3$ is 200 GPa.

Embodiment 5

The ink jet type recording head similar to the embodiment 4 was an embodiment 5 besides the protection film configured from $Al_2O_3$ having the film thickness of 45 nm.

Table 2 illustrates each condition (the film thickness t, the Young's modulus E, the product of the Young's modulus and the film thickness: E×t) of the embodiments 4 and 5, and illustrates the presence or absence of the burnout at the end portions of the active section, when performing evaluation of withstanding voltage.

TABLE 2

| | Material | Film Thickness (t) | Young's Modulus (E) | E × t | Burnout |
|---|---|---|---|---|---|
| Embodiment 4 | $Al_2O_3$ | 90 nm | 200 GPa | 9000 | ○ |
| Embodiment 5 | $Al_2O_3$ | 45 nm | 200 GPa | 4500 | ○ |

As shown in Table 2, also in the second embodiment, it was understood that the burnout of the piezoelectric layer is decreased. In other words, the burnout was observed at the end portion of the active section in the protection film where the product of the Young's modulus E and the film thickness t is 4500 (Pa·m) or more.

According to the first embodiment and the second embodiment, the burnout may be suppressed at the end portion of the active section, when the product of the Young's modulus E and the film thickness t is 5000 (Pa·m) or more.

Thus, it was understood that the protection film is formed at the boundary of the active section and the non-active section using the inorganic material and then the burnout is suppressed.

7. Application and Others

As for the invention, various modification examples may be considered.

In the embodiments described above, individual piezoelectric body is provided for each pressure generation chamber, however, a common piezoelectric body may be provided at a plurality of pressure generation chambers and individual electrode may be provided for each pressure generation chamber.

In the embodiments described above, a portion of the reservoir is formed at the flow path formation substrate, however, the reservoir may be formed at a member different from the flow path formation substrate.

In the embodiments described above, the upper side of the piezoelectric element is covered by the piezoelectric element holding section, however, the upper side of the piezoelectric element may be opened to the atmosphere.

In the embodiments described above, the pressure generation chamber is provided across the vibration plate opposite the piezoelectric element, however, the pressure generation chamber may be provided at the piezoelectric element side. For example, when a space, which is surrounded between the fixed plates and between the piezoelectric elements, is formed, the space may be the pressure generation chamber.

The liquid discharged from the liquid ejecting head may be a material which is capable of being discharged from the liquid ejecting head and includes liquids such as a solution in which dye or the like is dissolved in solvent, sol in which solid particles such as pigment or metal particles are dispersed to a dispersion medium. The liquid includes inks, liquid crystals, or the like. The liquid ejecting head may be provided in a manufacturing apparatus of a color filter such as a liquid crystal display, or the like, a manufacturing apparatus of the electrode such as an organic EL display, or the like, a manufacturing apparatus of a biochip, or the like, besides an image recording apparatus such as a printer.

As described above, according to the invention, technique, which improves the performance of the piezoelectric element having at least piezoelectric layer, the liquid ejecting head and the liquid ejecting apparatus, may be supplied by various embodiments.

In addition, a configuration which replaces each of the configurations disclosed in the embodiments and modification examples described above to each other or changes combination thereof, a configuration which replaces each of configurations disclosed in the related art, the embodiments and modification examples described above to each other or changes combination thereof, or the like may be carried into effect. The invention also includes the configurations.

What is claimed is:

1. A piezoelectric device comprising:
   a substrate having a chamber including a deformable portion;
   a first electrode positioned on a side of the substrate;
   a second electrode;
   a piezoelectric layer interposed between the first electrode and the second electrode; and
   a protection layer positioned on an opposing side of the piezoelectric layer relative to the first electrode;
   wherein the piezoelectric layer includes a non-active region which is not overlapped by the second electrode on the first electrode,
   the protection layer extends over the non-active region and the second electrode, and
   an entirety of the protection layer is positioned away from the deformable portion of the chamber in a longitudinal direction in a plan view.

2. The piezoelectric device of claim 1, wherein the protection layer includes an organic material.

3. The piezoelectric device of claim 1, wherein the protection layer includes an inorganic material.

4. The piezoelectric device of claim 1, wherein the piezoelectric layer includes an upper major surface and a lower major surface, and the protection layer covers a portion of the upper major surface that is covered by the common electrode.

5. The piezoelectric device of claim 1, wherein the protection layer is formed from a material including polyimide.

6. The piezoelectric device according to claim 1, wherein the protection layer is positioned away from the deformable portion of the chamber in the plan view such that an edge of the protection layer is laterally spaced apart from an edge of the chamber.

7. A piezoelectric device comprising:
   a substrate having a chamber including a deformable portion;
   a first electrode positioned on a side of the substrate;
   a second electrode;
   a piezoelectric layer interposed between the first electrode and the second electrode; and
   a protection layer positioned on an opposing side of the piezoelectric layer relative to the first electrode;
   wherein the piezoelectric layer includes a non-active region which is not overlapped by the second electrode on the first electrode,
   the protection layer extends over the non-active region and the second electrode, and
   an end portion of the protection layer over the second electrode is positioned away from the deformable portion of the chamber in a longitudinal direction in a plan view.

8. A liquid ejecting head, comprising:
a substrate having a plurality of chambers including a deformable portion;
a first electrode positioned on a side of the substrate;
a second electrode;
a piezoelectric layer interposed between the first electrode and the second electrode; and
a protection layer positioned on an opposing side of the piezoelectric layer relative to the first electrode,
wherein the piezoelectric layer includes a non-active region that is not overlapped by the second electrode on the first electrode;
the protection layer extends over the non-active region and the second electrode;
the plurality of chambers are arranged in a first direction; and
an entirety of the protection layer is positioned away from the deformable portion of the chambers in a second direction that is perpendicular to the first direction in a plan view.

9. The liquid ejecting head of claim 8, wherein the protection layer includes an organic material.

10. The liquid ejecting head of claim 8, wherein the protection layer includes an inorganic material.

11. The liquid ejecting head of claim 8, wherein the piezoelectric layer includes an upper major surface and a lower major surface, and the protection layer covers a portion of the upper major surface that is covered by the common electrode.

12. The liquid ejecting head of claim 8, wherein the protection layer is formed from a material including polyimide.

13. The liquid ejecting head of claim 8, wherein the protection layer is positioned away from the deformable portion of the chambers in the plan view such that an edge of the protection layer is laterally spaced apart from an edge of the chambers.

14. A liquid ejecting head, comprising:
a substrate having a plurality of chambers including a deformable portion;
a first electrode positioned on a side of the substrate;
a second electrode;
a piezoelectric layer interposed between the first electrode and the second electrode; and
a protection layer positioned on an opposing side of the piezoelectric layer relative to the first electrode,
wherein the piezoelectric layer includes a non-active region that is not overlapped by the second electrode on the first electrode;
the protection layer extends over the non-active region and the second electrode;
the plurality of chambers are arranged in a first direction; and
an end portion of the protection layer over the second electrode is positioned away from the deformable portion of the chambers in a second direction that is perpendicular to the first direction in a plan view.

* * * * *